United States Patent
Radinski et al.

(10) Patent No.: US 8,773,905 B1
(45) Date of Patent: Jul. 8, 2014

(54) IDENTIFYING AND MITIGATING RESTRICTED SAMPLING VOLTAGE RANGES IN ANALOG MEMORY CELLS

(71) Applicant: Apple Inc., Cupertino, CA (US)

(72) Inventors: Alex Radinski, Hadera (IL); Barak Baum, Givatayim (IL); Eyal Gurgi, Petah-Tikva (IL); Micha Anholt, Tel-Aviv (IL); Ronen Dar, Tel Aviv (IL); Tomer Ish-Shalom, Herzeliya (IL); Yael Shur, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 7 days.

(21) Appl. No.: 13/786,792

(22) Filed: Mar. 6, 2013

(51) Int. Cl.
*G11C 16/26* (2006.01)
*G11C 16/34* (2006.01)
*G11C 27/00* (2006.01)
*G11C 16/04* (2006.01)

(52) U.S. Cl.
CPC ............... *G11C 27/00* (2013.01); *G11C 16/26* (2013.01); *G11C 16/04* (2013.01); *G11C 2211/5641* (2013.01)

USPC ............ 365/185.03; 365/185.21; 365/185.24; 365/45

(58) Field of Classification Search
CPC . G11C 16/26; G11C 16/04; G11C 2211/5641
USPC ....................... 365/185.03, 185.21, 185.24, 45
See application file for complete search history.

(56) References Cited

U.S. PATENT DOCUMENTS

| 8,527,819 B2 * | 9/2013 | Shalvi et al. .................. 714/710 |
| 2010/0199150 A1 * | 8/2010 | Shalvi et al. .................. 714/773 |

* cited by examiner

*Primary Examiner* — Ly D Pham
(74) *Attorney, Agent, or Firm* — Meyertons, Hood, Kivlin, Kowert & Goetzel, P.C.

(57) ABSTRACT

A method includes performing a read operation that reads data from a group of analog memory cells using at least one read threshold, to produce readout results. A detection is made that the read threshold is set in a restricted range that causes the readout results not to reflect the read threshold. The data is reproduced from the group of the memory cells while compensating for the read threshold that is set in the restricted range.

35 Claims, 3 Drawing Sheets

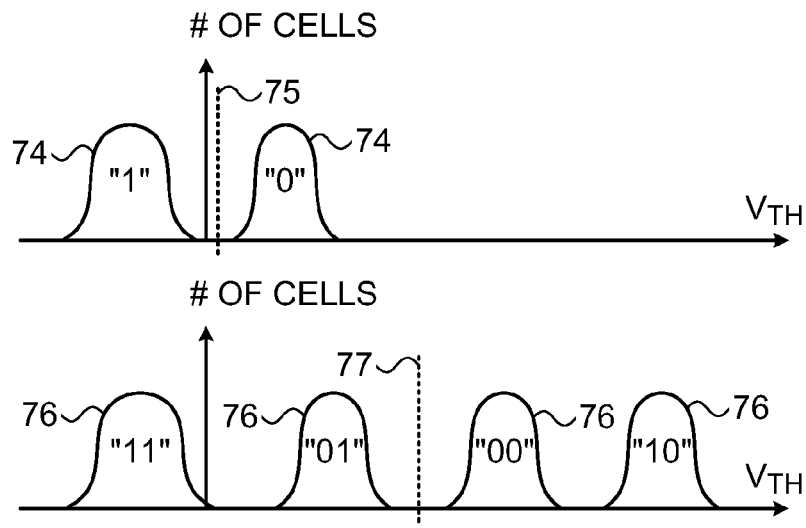
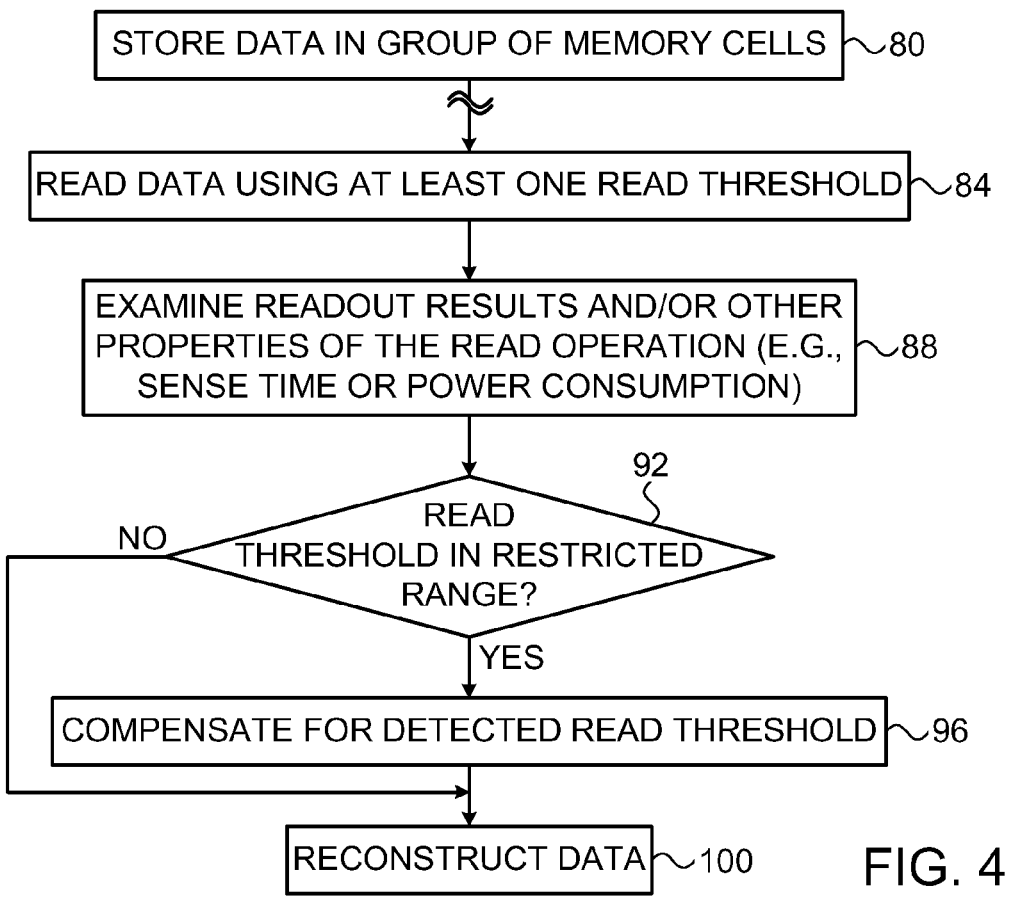
FIG. 3
FIG. 4

IDENTIFYING AND MITIGATING RESTRICTED SAMPLING VOLTAGE RANGES IN ANALOG MEMORY CELLS

FIELD OF THE INVENTION

The present invention relates generally to data storage, and particularly to methods and systems for reading analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as analog storage values, storage values or analog values. In Flash memories, for example, each analog memory cell holds a certain amount of electrical charge. The range of possible analog values is typically divided into regions, each region corresponding to a programming state or programming level that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Analog memory cells are typically read by comparing their storage values to one or more read thresholds. Various methods for setting and adjusting read thresholds are known in the art. For example, U.S. Patent Application Publication 2010/0091535, whose disclosure is incorporated herein by reference, describes a method for operating a memory that includes a plurality of analog memory cells. The method includes storing data in the memory by writing first storage values to the cells. Second storage values are read from the cells, and a Cumulative Distribution Function (CDF) of the second storage values is estimated. The estimated CDF is processed so as to compute one or more thresholds. As another example, U.S. Pat. No. 8,000,135, whose disclosure is incorporated herein by reference, describes techniques for estimation of memory cell read thresholds by sampling inside programming level distribution intervals.

U.S. Patent Application Publication 2011/0066902, whose disclosure is incorporated herein by reference, describes a system and method of reading data using a reliability measure. In some embodiments, a data storage device includes a memory array including a target memory cell and one or more other memory cells. The device also includes a controller coupled to the memory array. The controller is configured to directly compute a reliability measure for at least one bit stored in the target memory cell of the memory array based on a voltage value associated with the target memory cell and based on one or more corresponding voltage values associated with each of the one or more other memory cells of the memory array.

SUMMARY OF THE INVENTION

An embodiment of the present invention that is described herein provides a method including performing a read operation that reads data from a group of analog memory cells using at least one read threshold, to produce readout results. A detection is made that the read threshold is set in a restricted range that causes the readout results not to reflect the read threshold. The data is reproduced from the group of the memory cells while compensating for the read threshold that is set in the restricted range.

In an embodiment, detecting that the read threshold is in the restricted range includes detecting that the read threshold is set outside a voltage window defined for programming the analog memory cells. In another embodiment, detecting that the read threshold is in the restricted range includes detecting that the read threshold is set below zero.

In yet another embodiment, detecting that the read threshold is in the restricted range includes detecting that the read threshold is set to a value that misreads one or more flag cells that store a programming status of the group. In still another embodiment, detecting that the read threshold is in the restricted range includes detecting that a count of a given data value in the readout results deviates from an expected range.

In an example embodiment, detecting that the read threshold is in the restricted range includes detecting that a length of time taken by the read operation deviates from an expected value. In another disclosed embodiment, detecting that the read threshold is in the restricted range includes detecting that a power consumption of the read operation deviates from an expected value.

In an embodiment, detecting that the read threshold is in the restricted range includes reading a value from at least one flag cell that stores a programming status of the group, and detecting that the value deviates from an expected value. In some embodiments, the stored data is encoded with an Error Correction Code (ECC), and detecting that the read threshold is in the restricted range includes detecting that an error metric derived from the ECC deviates from an expected error metric.

In some embodiments, the data is encoded with an Error Correction Code (ECC), performing the read operation includes reading the memory cells in the group multiple times using multiple read thresholds, including the read threshold, and reproducing the data includes computing soft metrics based on the readout results of the multiple read thresholds, and decoding the ECC based on the soft metrics. Compensating for the read threshold in the restricted range may include omitting the readout results of the read threshold from computation of the soft metrics.

In an embodiment, reproducing the data while compensating for the read threshold includes re-positioning one or more of the multiple read thresholds so as not to fall in the restricted range, and re-reading the memory cells in the group using the re-positioned read thresholds. In another embodiment, compensating for the read threshold in the restricted range includes adjusting the soft metrics to account for the read threshold.

In some embodiments, the method includes storing multiple sets of the soft metrics, for multiple choices of the at least one read threshold that falls in the restricted range, in one or more tables while exploiting commonalities between the sets to compress the tables. In some embodiments, the method includes, upon detecting that the read operation reads a given page for the first time and that the readout results indicate that the given page is erased, verifying that the given page is erased by performing an additional read operation of the given page using one or more alternative read thresholds.

In some embodiments, performing the read operation includes reading the memory cells in the group multiple times using multiple read thresholds, including the read threshold, in order to apply an interference cancellation process to the group, and reproducing the data includes omitting the readout results of the read threshold from the interference cancellation process. In another embodiment, the group of the memory cells causes interference to one or more other memory cells, and reproducing the data includes reading the group in order to cancel the interference caused by the group.

There is additionally provided, in accordance with an embodiment of the present invention, apparatus including an interface and storage circuitry. The interface is configured to communicate with a memory including multiple analog memory cells. The storage circuitry is configured to perform a read operation that reads data from a group of the analog memory cells using at least one read threshold so as to produce readout results, to detect that the read threshold is set in a restricted range that causes the readout results not to reflect the read threshold, and to reproduce the data from the group of the memory cells while compensating for the read threshold that is set in the restricted range.

There is also provided, in accordance with an embodiment of the present invention, apparatus including a memory and storage circuitry. The memory includes multiple analog memory cells. The storage circuitry is configured to perform a read operation that reads data from a group of the analog memory cells using at least one read threshold so as to produce readout results, to detect that the read threshold is set in a restricted range that causes the readout results not to reflect the read threshold, and to reproduce the data from the group of the memory cells while compensating for the read threshold that is set in the restricted range.

The present invention will be more fully understood from the following detailed description of the embodiments thereof, taken together with the drawings in which:

BRIEF DESCRIPTION OF THE DRAWINGS

FIG. 3 is a diagram that schematically illustrates threshold voltage distributions and read thresholds in a group of analog memory cells, in accordance with an embodiment of the present invention;

FIG. 4 is a flow chart that schematically illustrates a method for identifying and compensating for a read threshold positioned in a restricted threshold voltage range, in accordance with an embodiment of the present invention.

DETAILED DESCRIPTION OF EMBODIMENTS

Overview

Figure 1:
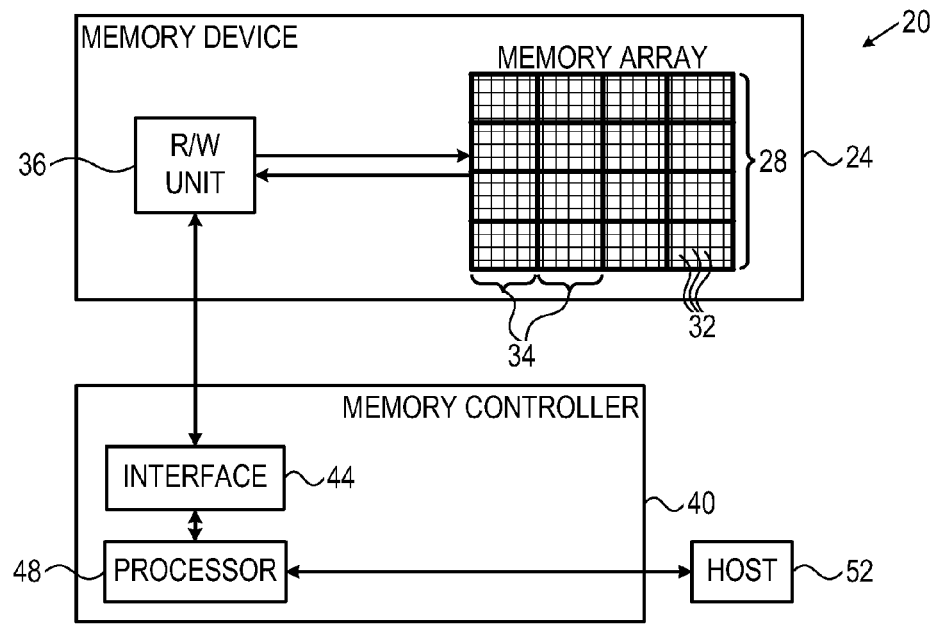
FIG. 1 is a block diagram that schematically illustrates a memory system, in accordance with an embodiment of the present invention.

In a typical memory device that comprises analog memory cells, the memory cells are read by comparing their analog values to one or more read thresholds. Practical memory devices typically have restricted ranges for positioning read thresholds. Setting a read threshold to a value in a restricted range produces readout results that do not reflect the intended value of the read threshold: Analog values that are below the intended read threshold value may be read consistently as being above it, or vice versa.

For example, a memory device typically has a predefined "voltage window" of threshold voltages that can be programmed and sensed. Setting a read threshold outside the voltage window, e.g., below zero, will produce erroneous readout results that do not reflect the intended read threshold value. This sort of restricted range is referred to herein as a static restricted range, since it is typically known in advance and does not change.

As another example, the memory device may assign in each group of memory cells (e.g., in each word line) one or more flag cells for storing the programming status of the group. The setting of read thresholds depends on the programming status. Therefore, misreading the flag cells will typically cause the readout results to be garbled. Thus, a range of read threshold values that causes misreading of the flag cells is also regarded as a restricted range. This sort of restricted range is referred to herein as a dynamic restricted range, since it is typically variable and not known in advance.

Reading memory cells using a read threshold that is positioned in a restricted range can cause performance degradation in various scenarios. For example, when searching for the optimal position of a read threshold, positioning the read threshold in a restricted range may produce readout results that lead to erroneous decision as to the optimal position. As another example, when computing soft decoding metrics based on multiple readout results using multiple offsets of a read threshold, positioning the read threshold in a restricted range may distort the soft decoding metrics and thus degrade the decoding performance.

Embodiments of the present invention that are described herein provide methods and systems for identifying read thresholds that are positioned in a restricted range, and for mitigating the effects of such read thresholds. In some embodiments, a memory controller stores data in a memory that includes analog memory cells. When performing a read operation using at least one read threshold, the memory controller identifies whether one or more of the read thresholds fall in a restricted range.

The identification may be based on the readout results, such as on the occurrence frequency of a certain data value, based on readout of the flag cells or based on Error Correction Code (ECC) metrics. Additionally or alternatively, the identification may be based on certain properties of the read operation, such as by detecting that the readout time or power consumption deviate from an expected range.

Other embodiments provide methods for correcting the effect of read thresholds that fall in restricted ranges. These methods are used, for example, when the memory controller computes soft decoding metrics based on multiple readout results using multiple read thresholds. If the memory controller identifies that one or more of the multiple read thresholds fall in a restricted range, it may omit these thresholds from the soft metric computation, and/or adjust the soft decoding metrics or their computation to account for these thresholds.

As yet another example, the memory controller may re-position one or more of the read thresholds so as not to fall in a restricted range, and adjust the decoding metrics to account for the re-positioned thresholds. Methods for efficient calculation and storage of the soft decoding metrics for various restricted range scenarios are also described.

The disclosed techniques compensate for the undesired effects of read thresholds that fall in restricted ranges. As such, these techniques improve the performance of processes such as soft decoding and read threshold adaptation. The disclosed techniques can also be used in conjunction with interference cancellation processes, so as to reduce the effects of interference such as electrical field cross-coupling between memory cells.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to two-dimensional (2D) cell connectivity schemes, the disclosed techniques are applicable to three-dimensional (3D) connectivity schemes, as well.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In some embodiments, the memory cells of a given bit line are divided into groups that are referred to as strings. The memory cells in each string are connected source-to-drain in series with one another, between the bit line and ground. Each string can typically be connected and disconnected individually to the bit line.

The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes techniques for reading data from memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W unit in any suitable manner, or performed by any one of these elements. Thus, in the context of the present patent application and in the claims, memory controller 40 and R/W circuitry 36 are referred to jointly as storage circuitry that carries out the disclosed techniques.

Figure 2A:
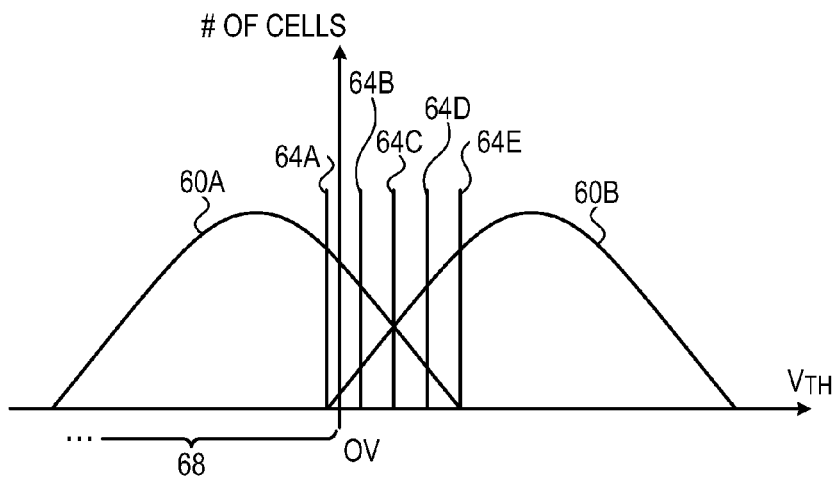
FIGS. 2A and 2B are diagrams that schematically illustrate read thresholds positioned in restricted threshold voltage ranges, in accordance with embodiments of the present invention.

Identification and Compensation for Read Thresholds Positioned in a Restricted Range FIG. 2A is a diagram that schematically illustrates a read threshold positioned in a restricted threshold voltage range, in accordance with an embodiment of the present invention. The figure shows two threshold voltage distributions 60A and 60B in a group of memory cells 32, typically a page. Each of the distributions represents a certain data value. For Single-Level Cells (SLC), programming levels 60A and 60B are the only levels, one representing "1" and the other representing "0". For Multi-Level Cells (MLC), programming levels 60A and 60B are two adjacent programming levels that are part of a larger set of programming levels.

In the present example, memory controller 40 attempts to read the memory cells in the group using five read thresholds denoted 64A ... 64E. The read thresholds are positioned with certain spacing in the boundary region between programming levels 60A and 60B. Reading the memory cells using multiple read thresholds can be used, for example, to find the optimal read threshold position for distinguishing between levels 60A and 60B. As another example, the multiple readout results obtained using the multiple read thresholds can be used for generating soft decoding metrics that are subsequently used for decoding the stored data.

As can be seen in the figure, read threshold 64A is set to a negative threshold voltage ($V_{TH}$). R/W unit 36 in the present example is unable to set negative read thresholds. Attempting to set a negative read threshold will produce readout results that do not reflect the intended position of the threshold. For example, the threshold may actually be set to 0V instead of the intended negative value, and the readout results will therefore be erroneous.

Therefore, a range 68 of negative threshold voltages is regarded as a restricted range that causes the readout results not to reflect the read threshold. Various techniques for identifying read thresholds that are set in a restricted range, and various techniques for mitigating such situations, are described below.

Figure 2B:
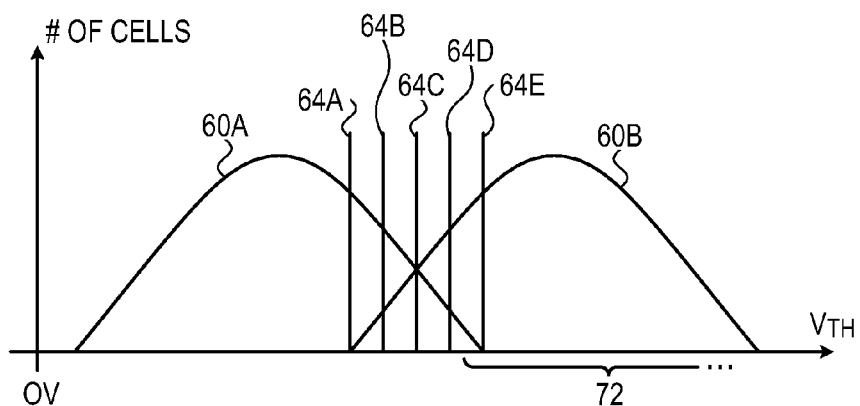

FIG. 2B is a diagram that schematically illustrates a read threshold positioned in a restricted threshold voltage range, in accordance with another embodiment of the present invention. In the example of FIG. 2B, read threshold 64E is set in a restricted range 72 that causes the readout results not to reflect the read threshold. In other words, the restricted range may be located in the upper or lower end of the threshold voltage window. One example of a high-end restricted range is when trying to read using a read threshold that is above the maximum read voltage that the R/W unit is able to apply.

In practice, the actual restricted ranges may be slightly larger than the ranges shown in FIGS. 2A and 2B because of imprecise voltage generation in R/W unit 36. If the R/W unit generates the read thresholds with limited accuracy, then the restricted range may be extended by the maximum expected generation error.

Some types of restricted ranges are static, while other types are dynamic. A static restricted range does not vary over time, and is typically known to the memory controller in advance. A dynamic restricted range may vary over time, and the memory controller should typically detect it adaptively. One example of a dynamic restricted range has to do with correct or incorrect readout of flag cells, as explained in the following description.

FIG. 3 is a diagram that schematically illustrates threshold voltage distributions and read thresholds in a group of analog memory cells, in accordance with an embodiment of the present invention. In this embodiment, memory cells 32 comprise MLC, and each group of memory cells stores multiple pages in respective MLC bits of the memory cells. For the sake of clarity, the description refers to a group of 2 bits/cell MLC that stores a least Significant Bit (LSB) page and a Most Significant Bit (MSB) page. The disclosed techniques, however, can be used with any other suitable type of MLC, such as 3 bits/cell or 4 bits/cell memory.

The top graph in FIG. 3 shows the threshold voltage distribution in the memory cells when only the LSB page is programmed. In this case, each memory cell in the group is programmed to one of two programming levels 74. One programming level 74 represents LSB="1" and the other programming level 74 represents LSB="0". Memory controller 40 reads the LSB page in this case using a read threshold 75, which is typically located around the mid-point between levels 74.

The bottom graph in FIG. 3 shows the threshold voltage distribution in the memory cells when both the LSB page and the MSB page are programmed. In this case, each memory cell in the group is programmed to one of four programming levels 76, representing the {MSB,LSB} data values {1,1},{0,1},{0,0} and {1,0}. In this situation, the memory controller reads the LSB page using a read threshold 77.

Read thresholds 75 (top graph) and 77 (bottom graph) are both LSB thresholds that are used for reading the LSB page from the group of memory cells. Nevertheless, the values of read thresholds 75 and 77 are different. Thus, the memory controller uses a different read threshold for reading the LSB page, depending on whether the MSB page is programmed or not.

Typically, one or more of the memory cells in the group are used for storing data that is indicative of the programming status of the group, i.e., whether the group is erased, stores only an LSB page, or stores both an LSB page and an MSB page. These memory cells are referred to as "flag cells." The memory controller typically reads the flag cells and uses the indication they hold to set the read thresholds properly.

As can be seen in the figure, erroneous decoding of the flag cells will cause erroneous positioning of the LSB read threshold, and thus incorrect LSB data. Consider, for example, a scenario in which only the LSB page is programmed, but the memory controller decides (because of erroneous flag cell decoding) that both LSB and MSB pages are programmed. In such a case, the actual threshold voltage distributions are in accordance with the top graph of FIG. 3. The memory controller, however, will read the LSB page using read threshold 77 instead of 75. As a result, the readout results will be all "1".

In the opposite case of erroneous flag cell readout, the actual threshold voltage distributions are in accordance with the bottom graph of FIG. 3, but the memory controller reads the LSB page using read threshold instead of 77. Again, the readout results do not reflect the intended read threshold.

Thus, a range of threshold voltages that causes the memory controller to decode the flag cells incorrectly is regarded as a restricted range. This sort of restricted range is dynamic, because it may vary over time and is not known to the memory controller in advance.

Note that the errors caused by placing a read threshold in a restricted range are distinctly different from placing a read threshold in a non-optimal position. In the latter case, the number of errors in the readout results may increase, but the threshold position still reflects the intended read threshold. In the latter case, on the other hand, the readout results do not reflect the stored data at all, i.e., the error degradation is catastrophic.

FIG. 4 is a flow chart that schematically illustrates a method for identifying and compensating for a read threshold positioned in a restricted threshold voltage range, in accordance with an embodiment of the present invention. The method begins with memory controller 40 storing data in a group of memory cells 32, at a storage step 80.

At a certain point in time, the memory controller reads the data using at least one read threshold, at a readout step 84. The memory controller examines the readout results and/or certain properties of the readout operation in order to identify one or more read thresholds that are positioned in a restricted range, at an examination step 88.

If the memory controller finds a read threshold that is positioned in a restricted range, at an identification step 92, it compensates for the distortion caused by this read threshold, at a compensation step 96. The memory controller then reconstructs the data stored in the group of memory cells, at a reconstruction step 100. The reconstruction takes into account the compensation of step 96. If the memory controller does not find any read threshold that is positioned in a restricted range at step 92, then step 96 is skipped.

The memory controller may use various techniques for identifying read thresholds that are placed in restricted ranges, e.g., below zero, above the maximum voltage window, in a range that causes erroneous decoding of flag cells, or any other suitable kind of restricted range. Upon finding such a threshold, the memory controller may use various techniques to compensate for the effect of this read threshold.

Identification of Dynamic Restricted Ranges

In some embodiments, memory controller 40 identifies that a read threshold is placed in a dynamic restricted range, even though the range itself is not known explicitly. The example identification techniques described below are typically used when the programming status of the group (e.g., word line) is known, e.g., it is known that both LSB and MSB are programmed. These techniques can also be used, for example, following failure to read the MSB page even though it is known that the MSB page is programmed.

In one embodiment, the memory controller counts the occurrences of a certain data value (e.g., "1") in the readout results, and decides that the read threshold is in a restricted range if the number of occurrences deviates from a predefined expected range. Typically, the data in a page is randomized, e.g., by scrambling, and therefore approximately half of the data values should be "1" and half should be "0". Considerable deviation from this distribution is a good indication that the read threshold is in a restricted range.

For example, when reading an MSB page and misreading the flag cells, R/W unit 36 will typically consider the MSB page as erased and return all-"1"s data. If such values are returned when reading an MSB page that is known to be programmed, the memory controller may conclude that the read threshold is in a dynamic restricted range.

Another example scenario occurs when reading an LSB page of a word line in which both the LSB page and the MSB page are programmed. In this case, misreading the flag cells will result in reading the LSB page with a wrong read threshold that is lower than the appropriate read threshold (e.g., reading using threshold 75 instead of 77 of FIG. 3). It is expected that the number of "1" occurrences will not decrease as the read threshold increases. Thus, if memory controller 40 detects an unexpected drop in the number of "1"s, it may decide that the flag cells were misread and that the read threshold is in a dynamic restricted range. In this case it may be needed to read the memory cells using a read threshold that is guaranteed to read the flag cells properly, and to establish a baseline count of "1" occurrences using the readout results of this read threshold. Considerable deviation from this baseline count is used as an indication of a restricted range.

In other embodiments, memory controller 40 measures or estimates the overall length of time taken by the read operation, and decides that the read threshold is in a restricted range if the readout time deviates considerably from an expected value, e.g., by more than a predefined amount. The readout time of R/W unit 36 is substantially deterministic and known for a given type of page readout (e.g., LSB or MSB readout) and a given word-line programming status (only LSB programmed, both LSB and MSB programmed). If the flag cells are misread, the R/W unit applies a different readout sequence, and the readout time will deviate considerably from the expected time.

For example, when the R/W unit reads an LSB page in a word line whose MSB page is also programmed, the R/W unit typically performs a single-threshold sense operation having a certain sense time. If the word line is found to be partially programmed (LSB only) or erased, the R/W unit performs another sense operation with a different threshold, thereby considerably increasing the overall readout time. As another example, when reading a programmed MSB page, the R/W unit senses the memory cells using two read thresholds. On the other hand, when reading an erased MSB page or when the R/W unit assumes that the MSB page is erased, a single-threshold sense is performed and the sense time is thus lower than in the former case. Therefore, deviations in the sense time are a good indication that a read threshold is in a dynamic restricted range.

In some embodiments, the memory controller measures or estimates the electrical power consumed by the read operation, and decides that the read threshold is in a restricted range if the power consumption deviates considerably from an expected value, e.g., by more than a predefined amount. The rationale behind this criterion is similar to that of the readout time criterion: The power consumption of a read operation is substantially deterministic and known for a given type of page readout (e.g., LSB or MSB readout) and a given word-line programming status (only LSB programmed, both LSB and MSB programmed). If the flag cells are misread, the R/W unit applies a different readout sequence, and the power consumption will deviate considerably from the expected value.

In some embodiments, memory device 24 support reading of the flag cells separately from (e.g., before and/or after) reading the data from the word line. In such a memory device, the memory controller may read the flag cells, compare them to expected flag cell values, and decide that the read threshold is in a restricted range if the read values differ from the expected values.

In other embodiments, the data stored in the group of memory cells is encoded with an Error Correction Code (ECC), and memory controller 40 decides whether a read threshold is in a restricted range based on metrics derived from the ECC. When the ECC is represented by a set of check equations, the number of equations that are not satisfied by the read data can serve as such a metric. This number is referred to as "syndrome sum," and can be used as a soft metric that is indicative of the number of errors in the data. The syndrome sum typically remains a valid metric even when the ECC decoding fails, and is therefore suitable for use in scenarios such as misreading of flag cells. In an embodiment, the memory controller calculates the syndrome sum for the read data, and decides that the read threshold is in a restricted range if the syndrome sum exceeds a certain permitted value.

The identification criteria described above are given purely by way of example. In alternative embodiments, memory controller 40 may use any other suitable criterion for deciding whether a read threshold is positioned in a restricted range.

Mitigating the Effect of Restricted Ranges on Soft ECC Decoding

In some embodiments, the data stored in the group of memory cells is encoded with an ECC, and memory controller 40 decodes the ECC in a soft decoding process. In such a process, the memory controller reads the memory cells multiple times using multiple sets of read thresholds that are positioned at certain offsets relative to one another. Based on the multiple readout results obtained using the multiple threshold sets, the memory controller computes soft metrics that indicate the confidence levels of the reconstructed data values. The soft metrics are then used as input to the soft decoding process of the ECC. The soft metrics may comprise, for example, Log Likelihood Ratios (LLRs).

Figure 5:
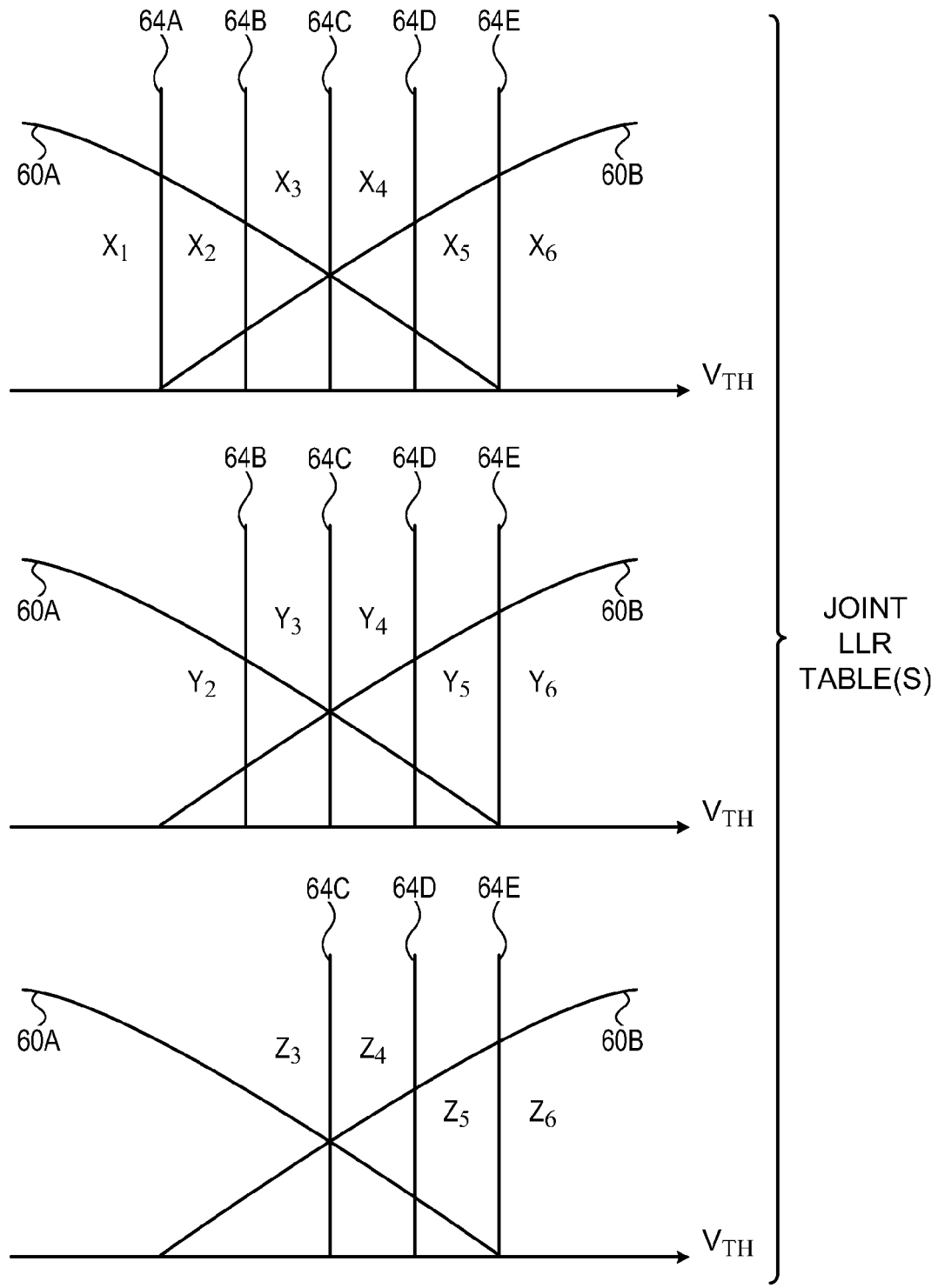
FIG. 5 is a diagram that schematically illustrates multiple scenarios of read thresholds positioned in restricted threshold voltage ranges, which are jointly encoded in a Log Likelihood Ratio (LLR) table, in accordance with an embodiment of the present invention.

FIG. 5 is a diagram that schematically illustrates multiple scenarios of read thresholds positioned in restricted threshold voltage ranges, which are jointly encoded in a Log Likelihood Ratio (LLR) table, in accordance with an embodiment of the present invention.

The top graph in FIG. 5 shows the boundary region between programming levels 60A and 60B, and five read thresholds 64A ... 64E that are distributed in this boundary region. The five read thresholds divide the $V_{TH}$ axis into six intervals denoted $X_1 \ldots X_6$.

The readout results from memory cells whose $V_{TH}$ is in interval $X_1$ or $X_6$ can typically be assigned a high confidence level, since the interval is far away from the boundary region and therefore has a small error probability. The readout results from memory cells whose $V_{TH}$ is in interval $X_2$ or $X_5$ can typically be assigned a medium confidence level, since the $V_{TH}$ is closer to the boundary region and has some probability of being misread. The readout results from memory cells whose $V_{TH}$ is in interval $X_3$ or $X_4$ should typically be assigned a low confidence level, since the $V_{TH}$ is close to the boundary region and is has a relatively high likelihood of being misread.

Therefore, by reading each memory cell using the five read thresholds, the memory controller is able to assign the readout result of each memory cell a respective soft decoding metric (e.g., LLR) that indicates the confidence level of the readout result.

Consider now a scenario in which read threshold 64A is in a restricted range. In this scenario, the memory cells whose $V_{TH}$ falls in interval $X_1$ cannot be distinguished from the memory cells whose $V_{TH}$ falls in interval $X_2$. In other words, only the union of $X_1$ and $X_2$ is known to the decoder. Thus, assigning to $X_1$ a higher confidence level than $X_2$ is incorrect.

Another possible scenario, when read threshold 64A is in a restricted range, is that all the memory cells in $X_1$ and $X_2$ will be read as belonging to $X_1$. This scenario too may distort the soft metrics assigned to the readout results of these cells.

In various embodiments, memory controller 40 may use different methods for computing the soft decoding metrics in a manner that overcomes the above-described effect of the restricted ranges. In some embodiments, if the memory controller identifies that one or more of the read thresholds are in a restricted range, it disregards the readout results of these read thresholds (i.e., omits them from the soft metric computation) and uses only the remaining thresholds for computing the soft metrics.

This sort of scenario is demonstrated in the middle graph of FIG. 5. As can be seen in the figure, read threshold 64A is disregarded because it is found to be in a restricted range. The remaining four read thresholds 64B ... 64E divide the $V_{TH}$ axis into five intervals denoted $Y_2 \ldots Y_6$. In some embodiments, the memory controller applies a correction to the soft metrics so as to compensate for this imbalance (i.e., to compensate for the absence of threshold 64A). Typically, the memory controller assigns a new soft metric to the memory cells whose $V_{TH}$ falls in interval $Y_2$, since the composition of memory cells within this interval is different from $X_1$ or $X_2$.

In another embodiment, the memory controller does not disregard the read threshold(s) that is in a restricted range, but rather modifies the confidence levels assigned to the different $V_{TH}$ intervals to account for the effect of the invalid read threshold. In the example of FIG. 5, the memory controller may assign intervals $X_1$ ad $X_2$ the same confidence level that de-facto disregards read threshold 64A.

In yet another embodiment, upon identifying that one or more read thresholds are in a restricted range, the memory controller modifies the positions of one or more of the read thresholds so as not to fall in the restricted range. In addition, the memory controller typically modifies the confidence levels assigned to the different $V_{TH}$ intervals to match the new read threshold positions. Without considering restricted ranges, the number of read thresholds, their positions and the associated confidence levels are optimized statistically using a test sample set. In an example embodiment, it is possible to repeat this sort of optimization according to the identities of the read thresholds that fall in restricted ranges.

For example, let the values of read thresholds 64A . . . 64E be −V2, −V1, 0, V1, V2, respectively. (The center threshold is denoted 0 and the other thresholds are spaced symmetrically around it purely by way of example.) If threshold 64A is in a restricted range, the samples at −V2 are expected to be invalid. In an embodiment, the memory controller may decide to re-position the five read thresholds at −V1, −Vx, 0, V1, V2, and adjust the confidence levels of intervals $X_1 \ldots X_6$ according to the new threshold positions. Another possibility is that the memory controller decides to re-position the five read thresholds at −V1, 0, V1, V2, V3, and again adjust the confidence levels of intervals $X_1 \ldots X_6$ accordingly. Yet another possibility is to re-position the five read thresholds at −Vx, −Vy, 0, V1, V2, such that Vx is guaranteed (or validated) to be a valid sample.

Generally, given a certain limitation on the read threshold positions, given an assumed $V_{TH}$ distribution model, and given the position of the assumed optimal read threshold, the memory controller may evaluate an optimization function that maximizes the Mutual Information (MI) and chooses the modified read threshold positions and confidence levels accordingly.

The techniques above refer to a single read threshold that distinguishes between two adjacent programming levels, e.g., an LSB threshold. In MSB readout, however, the memory controller uses two read thresholds. In some embodiments, the memory controller may carry out the above techniques separately for the upper and lower MSB thresholds.

Efficient Calculation and Storage of Soft Metric Tables

In some embodiments, memory controller 40 holds one or more tables that give the soft metric values (e.g., LLRs) for the different $V_{TH}$ intervals (e.g., intervals $X_1 \ldots X_6$ in FIG. 5). When accounting for various combinations of read thresholds that may fall in restricted ranges, the number of tables and the associated memory space and complexity may be prohibitive.

FIG. 5, for example, shows three different configurations of $V_{TH}$ intervals: The top configuration (intervals $X_1 \ldots X_6$ and the associated confidence levels) is used when no read threshold falls in a restricted range. The middle configuration (intervals $Y_2 \ldots Y_6$ and the associated confidence levels) is used when read threshold 64A falls in a restricted range. The bottom configuration (intervals $Z_3 \ldots Z_6$ and the associated confidence levels) is used when both read thresholds 64A and 64B fall in a restricted range.

The configurations of FIG. 5 refer to the left-most read thresholds falling in a restricted range. In practice, the right-most read thresholds may fall in a restricted range, as well. Accounting for all possible combinations implies the use of nine $V_{TH}$ interval configurations. For MSB readout, each of the two MSB thresholds has nine configurations that should be accounted for, bringing the total number of $V_{TH}$ interval configurations to 81. Holding 81 tables of soft metrics in the memory controller may be prohibitive. In some embodiments, memory controller 40 reduces the required memory space by exploiting commonalities between the different tables.

One property that can be exploited is that there is typically no correlation between the restricted range on the left-hand-side and the restricted range on the right-hand-side of the optimal threshold position. By considering each side separately, the number of tables (for a single threshold) can be reduced from nine to six. Upon identifying the specific restricted range or ranges that occur in a given scenario, the memory controller may combine the tables to produce a single table that gives the appropriate soft metrics for that scenario.

Extending this feature to MSB readout, the number of tables can be reduced from 81 to twelve (six for the upper MSB threshold and six for the lower MSB threshold). Here, too, upon identifying the specific restricted range or ranges occurring in a given scenario, the memory controller may combine the tables to produce a single table.

Another commonality that can be exploited is that a threshold falling in a restricted range only affects the $V_{TH}$ interval in its vicinity. For example, as can be seen in the middle graph of FIG. 5, omitting threshold 64A affects only intervals $X_1$ and $X_2$ that become $Y_2$. The other intervals are not affected, i.e., $Y_3=X_3$, $Y_4=X_4$, $Y_5=X_5$ and $Y_6=X_6$. Therefore, out of the twelve tables described above, four tables have three values each (e.g., $X_1, X_2, X_3$ or $X_4, X_5, X_6$), and the remaining eight tables have a single value each (e.g., $Y_2, Z_3$).

In yet another embodiment, the memory controller holds the cell VTH distribution, and calculates the confidence level per $V_{TH}$ interval in accordance with the actual restricted range scenario as it occurs.

Verifying Erased Page Readout

When memory controller 40 uses adaptive read thresholds, reading a given page for the first time may be performed with read thresholds that are not properly adapted yet. When the readout result of such a first read operation indicates that the page is erased, the result could be due to misreading the flag cells, because the read thresholds are not yet adapted. In some embodiments, memory controller 40 takes measures to prevent this undesired scenario.

In an example embodiment, when the memory controller reads a page for the first time and receives an "erased page" result, the memory controller performs another read operation with read thresholds that are guaranteed to read the flag cells correctly. If the second read operation verifies that the page is indeed erased, the memory controller regards the page as erased.

Otherwise (i.e., if the second read operation indicates that the page is programmed and returns data) the memory controller regards the page as programmed. The memory controller may then retrieve the data in any suitable way (e.g., apply some other read threshold values). Note that the second read operation may be the LSB readout operation used above for identifying that a threshold falls in a restricted range.

Combination with Interference Cancellation

In some embodiments, processor 48 carries out an interference cancellation process for canceling the effects of interference (e.g., cross-coupling interference) in memory cells 32. The disclosed techniques may be combined with interference cancellation.

For example, in some interference cancellation processes processor 48 reads one or more neighboring word lines and cancels the interference they cause. When reading the neighboring word lines, if processor 48 detects that the readout results are unexpected (e.g., any of the examples described above) and may be caused by a read threshold falling in a restricted range, the processor may repeat the readout operation (of a neighboring word line) with another set of read threshold that is known not to fall in a restricted range. The latter readout results may be used to validate whether the former readout results were indeed distorted by a restricted range.

As another example, in some embodiments processor 48 reads the interference word line multiple times using multiple read threshold sets as part of the interference cancellation process. In such embodiments, if processor detects unexpected readout results in one of the readout operations (of the interfered word line), these readout results are ignored and omitted from the interference cancellation calculations.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
performing a read operation that reads data from a group of analog memory cells using at least one read threshold, to produce readout results;
detecting that the read threshold is set in a restricted range that causes the readout results not to reflect the read threshold; and
reproducing the data from the group of the memory cells while compensating for the read threshold that is set in the restricted range.

2. The method according to claim 1, wherein detecting that the read threshold is in the restricted range comprises detecting that the read threshold is set outside a voltage window defined for programming the analog memory cells.

3. The method according to claim 1, wherein detecting that the read threshold is in the restricted range comprises detecting that the read threshold is set below zero.

4. The method according to claim 1, wherein detecting that the read threshold is in the restricted range comprises detecting that the read threshold is set to a value that misreads one or more flag cells that store a programming status of the group.

5. The method according to claim 1, wherein detecting that the read threshold is in the restricted range comprises detecting that a count of a given data value in the readout results deviates from an expected range.

6. The method according to claim 1, wherein detecting that the read threshold is in the restricted range comprises detecting that a length of time taken by the read operation deviates from an expected value.

7. The method according to claim 1, wherein detecting that the read threshold is in the restricted range comprises detecting that a power consumption of the read operation deviates from an expected value.

8. The method according to claim 1, wherein detecting that the read threshold is in the restricted range comprises reading a value from at least one flag cell that stores a programming status of the group, and detecting that the value deviates from an expected value.

9. The method according to claim 1, wherein the stored data is encoded with an Error Correction Code (ECC), and wherein detecting that the read threshold is in the restricted range comprises detecting that an error metric derived from the ECC deviates from an expected error metric.

10. The method according to claim 1, wherein the data is encoded with an Error Correction Code (ECC), wherein performing the read operation comprises reading the memory cells in the group multiple times using multiple read thresholds, including the read threshold, and wherein reproducing the data comprises computing soft metrics based on the readout results of the multiple read thresholds, and decoding the ECC based on the soft metrics.

11. The method according to claim 10, wherein compensating for the read threshold in the restricted range comprises omitting the readout results of the read threshold from computation of the soft metrics.

12. The method according to claim 10, wherein reproducing the data while compensating for the read threshold comprises re-positioning one or more of the multiple read thresholds so as not to fall in the restricted range, and re-reading the memory cells in the group using the re-positioned read thresholds.

13. The method according to claim 10, wherein compensating for the read threshold in the restricted range comprises adjusting the soft metrics to account for the read threshold.

14. The method according to claim 10, and comprising storing multiple sets of the soft metrics, for multiple choices of the at least one read threshold that falls in the restricted range, in one or more tables while exploiting commonalities between the sets to compress the tables.

15. The method according to claim 1, and comprising, upon detecting that the read operation reads a given page for the first time and that the readout results indicate that the given page is erased, verifying that the given page is erased by performing an additional read operation of the given page using one or more alternative read thresholds.

16. The method according to claim 1, wherein performing the read operation comprises reading the memory cells in the group multiple times using multiple read thresholds, including the read threshold, in order to apply an interference cancellation process to the group, and wherein reproducing the data comprises omitting the readout results of the read threshold from the interference cancellation process.

17. The method according to claim 1, wherein the group of the memory cells causes interference to one or more other memory cells, and wherein reproducing the data comprises reading the group in order to cancel the interference caused by the group.

18. Apparatus, comprising:
an interface, which is configured to communicate with a memory comprising multiple analog memory cells; and
storage circuitry, which is configured to perform a read operation that reads data from a group of the analog memory cells using at least one read threshold so as to produce readout results, to detect that the read threshold is set in a restricted range that causes the readout results not to reflect the read threshold, and to reproduce the data from the group of the memory cells while compensating for the read threshold that is set in the restricted range.

19. The apparatus according to claim 18, wherein the storage circuitry is configured to detect that the read threshold is in the restricted range by detecting that the read threshold is set outside a voltage window defined for programming the analog memory cells.

20. The apparatus according to claim 18, wherein the storage circuitry is configured to detect that the read threshold is in the restricted range by detecting that the read threshold is set below zero.

21. The apparatus according to claim 18, wherein the storage circuitry is configured to detect that the read threshold is in the restricted range by detecting that the read threshold is set to a value that misreads one or more flag cells that store a programming status of the group.

22. The apparatus according to claim 18, wherein the storage circuitry is configured to detect that the read threshold is in the restricted range by detecting that a count of a given data value in the readout results deviates from an expected range.

23. The apparatus according to claim 18, wherein the storage circuitry is configured to detect that the read threshold is in the restricted range by detecting that a length of time taken by the read operation deviates from an expected value.

24. The apparatus according to claim 18, wherein the storage circuitry is configured to detect that the read threshold is in the restricted range by detecting that a power consumption of the read operation deviates from an expected value.

25. The apparatus according to claim 18, wherein the storage circuitry is configured to detect that the read threshold is in the restricted range by reading a value from at least one flag cell that stores a programming status of the group, and detecting that the value deviates from an expected value.

26. The apparatus according to claim 18, wherein the stored data is encoded with an Error Correction Code (ECC), and wherein the storage circuitry is configured to detect that the read threshold is in the restricted range by detecting that an error metric derived from the ECC deviates from an expected error metric.

27. The apparatus according to claim 18, wherein the data is encoded with an Error Correction Code (ECC), and wherein the storage circuitry is configured to read the memory cells in the group multiple times using multiple read thresholds, including the read threshold, to compute soft metrics based on the readout results of the multiple read thresholds, and to decode the ECC based on the soft metrics.

28. The apparatus according to claim 27, wherein the storage circuitry is configured to compensate for the read threshold in the restricted range by omitting the readout results of the read threshold from computation of the soft metrics.

29. The apparatus according to claim 27, wherein the storage circuitry is configured to re-position one or more of the multiple read thresholds so as not to fall in the restricted range, and to re-read the memory cells in the group using the re-positioned read thresholds.

30. The apparatus according to claim 27, wherein the storage circuitry is configured to compensate for the read threshold in the restricted range by adjusting the soft metrics to account for the read threshold.

31. The apparatus according to claim 27, wherein the storage circuitry is configured to store multiple sets of the soft metrics, for multiple choices of the at least one read threshold that falls in the restricted range, in one or more tables while exploiting commonalities between the sets to compress the tables.

32. The apparatus according to claim 18, wherein the storage circuitry is configured to detect that the read operation reads a given page for the first time and that the readout results indicate that the given page is erased, and to verify that the given page is erased by performing an additional read operation of the given page using one or more alternative read thresholds.

33. The apparatus according to claim 18, wherein the storage circuitry is configured to read the memory cells in the group multiple times using multiple read thresholds, including the read threshold, in order to apply an interference cancellation process to the group, and to omit the readout results of the read threshold from the interference cancellation process.

34. The apparatus according to claim 18, wherein the group of the memory cells causes interference to one or more other memory cells, and wherein the storage circuitry is configured to read the group in order to cancel the interference caused by the group.

35. Apparatus, comprising:
a memory comprising multiple analog memory cells; and
storage circuitry, which is configured to perform a read operation that reads data from a group of the analog memory cells using at least one read threshold so as to produce readout results, to detect that the read threshold is set in a restricted range that causes the readout results not to reflect the read threshold, and to reproduce the data from the group of the memory cells while compensating for the read threshold that is set in the restricted range.

* * * * *